United States Patent [19]

Byers et al.

[11] Patent Number: 5,471,482
[45] Date of Patent: Nov. 28, 1995

[54] VLSI EMBEDDED RAM TEST

[75] Inventors: Larry L. Byers, Apple Valley; Donald W. Mackenthun, Fridley; Philip J. Fye, Maplewood; Gerald J. Maciona, Mounds View; Jeff A. Engel, Chisago City; Ferris T. Price, deceased, late of Mayer, by Robert H. Price, executor; Dale K. Seppa, New Brighton, all of Minn.

[73] Assignee: Unisys Corporation, Blue Bell, Pa.

[21] Appl. No.: 223,435

[22] Filed: Apr. 5, 1994

[51] Int. Cl.⁶ .......................... G01R 31/28; G01R 31/26; G01C 29/00
[52] U.S. Cl. .................. 371/21.2; 371/21.1; 371/21.3; 371/22.5; 371/25.1
[58] Field of Search .................................. 371/21.2, 21.3, 371/21.1, 22.5, 25.1; 365/201

[56] References Cited

U.S. PATENT DOCUMENTS

| | | | |
|---|---|---|---|
| 4,715,034 | 12/1987 | Jacobson | 371/21 |
| 4,873,705 | 10/1989 | Johnson | 371/21.2 |
| 4,918,378 | 4/1990 | Katircioglu et al. | 365/20.1 |
| 5,006,787 | 4/1991 | Katircioglu et al. | 324/73.1 |
| 5,034,923 | 7/1991 | Kuo et al. | 365/189.01 |
| 5,138,619 | 8/1992 | Fasang et al. | 371/21.1 |
| 5,173,906 | 12/1992 | Dreibelbis et al. | 324/22.5 |
| 5,198,758 | 3/1993 | Iknaian et al. | 324/158 |
| 5,199,034 | 3/1993 | Yeo et al. | 371/21.2 |

Primary Examiner—Robert W. Beausoliel, Jr.
Assistant Examiner—Alan M. Fisch
Attorney, Agent, or Firm—Nawrocki, Rooney & Sivertson

[57] ABSTRACT

A method for comprehensively testing embedded RAM devices and a means for detecting if any of the cells within the embedded RAM devices have a slow write recovery time. The preferred mode of the present invention utilizes built-in self-test (BIST) techniques for testing the embedded RAM's within a VLSI device. In accordance with the present invention, a modified 5N march test sequence is performed on the embedded RAM devices. The modified 5N March test sequence is a simple algorithm implemented in programmable hardware that has the capability of ensuring that the embedded RAM devices are functional and that they meet the recovery time requirements. The preferred mode of the present invention uses this algorithm to determine if the embedded RAMs are operating properly before the VLSI devices are used in card assembly. However, this method can also be used after card assembly to monitor the embedded RAM's integrity.

2 Claims, 10 Drawing Sheets

VLSI EMBEDDED RAM TEST

CROSS REFERENCE TO CO-PENDING APPLICATIONS

This invention is related to commonly assigned U.S. patent application Ser. No. 08/225,891, filed Apr. 11, 1994, and entitled "Control Store built-in self-test".

BACKGROUND OF THE INVENTION

1. Field of the Invention

The present invention generally relates to the functional testing of embedded memories, and more particularly relates to a method of and system for functionally testing memories embedded in VLSI devices at enhanced speeds while maintaining a high degree of accuracy.

2. Description of the Prior Art

Developments over the past decade in semiconductor technology have substantially increased the use of Random Access Memories (RAMs) within Very Large Scale Integration (VLSI) devices. Designers realized that a significant increase in system performance can be achieved by placing the RAM structures on the same semiconductor chip as the processing circuitry. In this configuration, RAM accesses can often be made in a single processor clock cycle and therefore significantly increasing system performance.

The strong desire of designers to place RAM structures on the same chip as the processing circuitry becomes readily apparent after analyzing the alternative. If discrete RAM devices are used within a system, the motherboard usually contains a processor chip along with a plurality of RAM devices. When the processor wants to access data from the RAM devices, the processor must send address data through the output buffers of the processor chip, across the board traces, and finally through the input buffers of the RAM chip. There is a relatively large amount of inductance and capacitance on this path due to the semiconductor package (e.g., via bond wires, bond pads, package power planes, package pins, etc) and the board traces. In addition, the delay associated with the input and output buffers of a semiconductor chip can be substantial. Finally, the input buffers of a semiconductor chip typically contain Electric Static Discharge (ESD) diodes which also add capacitance to the path. After the address reach the RAM device, the system must wait for the RAM to access the addressed data. When this is complete, the RAM device drives the data through the RAM output buffers, across the board traces, and through the input buffers of the processor chip. Again, the inductance and capacitance associated with this path can be substantial. This entire process must be completed in one processor clock cycle to have the RAM data available in the next clock cycle. This typically cannot be accomplished for modern processor with high clock rates and therefore places additional pressure on designers to incorporate RAM structures on the same chip as the processing circuitry.

Another unrelated reason why designers strongly prefer to place the RAM structures on the same chip as the processing circuitry is to reduce the pin count in the processor chip. A RAM device has a significant number of I/O signals which must be controlled and observed. The pin count of the processor chip can be substantially reduced by controlling the RAM signals internally and not provide an I/O pin for each.

A final reason for having embedded RAM structures is that often the size of a semiconductor die is determined by the number of I/O pins that must be provided. The size of the die, and hence the cost to produce the die, can often be reduced if the number of I/O pins can be minimized. Furthermore, there are physical packaging limitations which limit the number of I/O pins that are allowed for any given package. These constraints also provide a significant incentive for designers to place RAM structures on the same chip as the processing circuitry.

In the past decade there has been a rapid increase in the number of vendors which offer Application Specific Integrated Circuits (ASICs). ASICs provide a cost effective way of obtaining high speed and high density circuitry that is customized for a specific application. ASICs are semi-custom chips where the customer provides the logic design and the vendor creates the mask layers and performs the fabrication of the chip. The vendor will typically provide the customer with an ASIC library which contains a list of available component which can be used in the logic design of the customer's chip. The reason only a limited number of components are available is that each component must be layed out and simulated by the vendor to ensure proper functionality and performance. In the past decade, many more RAM structures have been added to ASIC libraries for use in customer designs for the reasons stated above. This, coupled with the strong desire to place RAMs on the same chip as the processing circuitry, has created a rapid increase in the number of VLSI devices containing embedded RAM's.

A significant problem created by placing embedded RAM structures within a VLSI device is that the input and output ports of the RAM structure are often not controllable or observable from the external I/O pins of the VLSI device. This makes it very difficult or even impossible to adequately test embedded RAM structures and ensure that they are fully functional. This concern is particularly important in high reliability systems.

Over the past decade, Built-In Self-Test (BIST) techniques have been developed to combat this and other test problems. One method for using BIST for testing on-chip memory is described in U.S. Pat. No. 5,138,619, issued to Fasang et al. Fasang uses a first Pseudo Random Pattern Generator (PRPG) for generating the addresses to the RAM and a second PRPG for generating the data inputs to the RAM. This eliminates the need to directly control the address and data ports of the RAM structure from the external I/O pins of the VLSI device. Fasang also suggests a method for using a Parallel Signature Analyzer (PSA) for creating a signature for the test results and comparing this signature to a known correct signature. A problem with Fasang is that the input test vectors to the RAM structure are random in nature and therefore do not test for some common RAM defects. For example, the method suggested in Fasang would not test for a slow write recovery time problem.

Another method for testing embedded RAM structures is discussed in U.S. Pat. No. 4,715,034 issued to Jacobson. Jacobson suggests using a Pseudo Random Pattern Generator for writing random bits into successive memory cells rather than writing the same bits or fixed sequence of bits into the cells. Jacobson suffers from the same problems as described under Fasang.

A similar method for testing embedded RAM structures is discussed in U.S. Pat. No. 5,173,906 issued to Dreibelbis et al. Dreibelbis suggests a method for using a data pattern generator instead of a PRPG for providing a predetermined set of data patterns to the embedded RAM structure. Dreibelbis also suggests an apparatus which uses conventional Level-Sensitive Scan Design (LSSD) techniques. In accordance with LSSD, Dreibelbis apparently suggests a multi-phase clocking technique for performing the testing algorithm. A problem with the method described by Dreibelbis is that it is complex and relatively difficult to implement in hardware. In addition, the LSSD method does not allow for testing of circuits at actual system speeds because multiphase clocking is not typically used during functional operation.

Another method for testing embedded RAM structures within a microprocessor is discussed in U.S. Pat. No. 4,873,705 issued to Johnson. The method described in Johnson requires a redundant microprocessor in addition to the microprocessor under test. The redundant microprocessor is used for performing the test algorithm on the microprocessor under test. A problem with the method suggested by Johnson is that a significant amount of support hardware is required to perform the test. In addition, the test sequence suggests by Johnson does not test for a slow write recovery problem.

SUMMARY OF THE INVENTION

The present invention overcomes the disadvantages found in the prior art by providing a method for comprehensively testing embedded RAM devices and for providing a means for detecting if any of the cells have a slow write recovery time. The preferred mode of the present invention utilizes built-in self-test (BIST) techniques for testing embedded RAM's within a VLSI device.

In accordance with the present invention, each VLSI device that has an embedded RAM also contains a BIST controller which initiates and controls a modified 5N march test sequence on the embedded RAM devices. The modified 5N March test sequence is a simple algorithm implemented in hardware that has the capability of ensuring that the embedded RAMs are functional and that they meet the write recovery time requirements. The preferred mode of the present invention uses this algorithm to determine if the embedded RAMs are operating properly before the VLSI devices are used in card assembly. This method can also be used after card assembly to monitor the embedded RAM's integrity.

The modified 5N march test sequence performs five (5) passes through the RAM addresses. During Pass 0, a background data pattern is built from an original seed and is written into each RAM cell within the embedded RAMs in ascending address order. During Pass 1, the address counter is reset to zero and the first address location is read and compared to the data pattern that was written in Pass 0. If the data read from this address location does not match the expected data pattern, a fault is issued and the test is aborted. An address register provides the address location of where the fault occurred (i.e., it identifies the bad cell within the RAM) and a fault data register provides the data read from the faulty RAM cell. This information can be scanned out of the design for further analysis. If the data read from this address location matches the expected pattern, a data pattern that was built from the complemented original seed is written to that address. Following this, and before incrementing the address counter, another read and compare is performed. This last read and compare ensures that the cell does not have a slow write recovery time problem. Again, if the data read does not match the expected pattern, a fault is issued and the test is aborted. These steps are performed for each address in the embedded RAM in ascending address order to complete Pass 1.

During Pass 2, the address counter is reset to zero and the first address location is read and compared to the data pattern that was written in Pass 1. If the data read from the first address location does not match the expected data pattern, a fault is issued and the test is aborted. If the data read from this address location matches the expected pattern, a data pattern that was built from the original seed is written to that address. Following this, and before incrementing the address counter, another read and compare is performed. Again, if the data read does not match the expected pattern, a fault is issued and the test is aborted. These steps are performed for each address in the embedded RAM in ascending address order to complete Pass 2.

During Pass 3, the address counter is set to the maximum address value and the last address location is read and compared to the data pattern that was written to that address in Pass 2. If the data read from this address location does not match the expected data pattern, a fault is issued and the test is aborted. If the data read from this address location matches the expected pattern, a data pattern that was built from the complemented original seed is written to that address. Following this, and before decrementing the address counter, another read and compare is performed. Again, if the data read does not match the expected pattern, a fault is issued and the test is aborted. These steps are performed for each address in the embedded RAM in descending address order to complete Pass 3.

During Pass 4, the address counter is set to the maximum address value and the last address location is read and compared to the data pattern that was written to that address in Pass 3. If the data read from this address location does not match the expected data pattern, a fault is issued and the test is aborted. If the data read from this address location matches the expected pattern, a data pattern that was built from the original data seed is written to that address. Following this, and before decrementing the address counter, another read and compare is performed. Again, if the data read does not match the expected pattern, a fault is issued and the test is aborted. These steps are performed for each address in the embedded RAM in descending address order to complete Pass 4.

The modified 5N march test sequence provides a comprehensive test of the embedded RAM structures. By writing both the original data pattern and the complemented data pattern the embedded RAM cells are tested for their storage capability including checking for stuck bits. By writing the embedded RAM in a forward sequence (i.e. ascending address order) the test ensures that writing into cell "I" does not disturb the contents of cell "J" where "I" and "J" are contiguous cells and "I" is before "J" in memory. By writing the embedded RAM in a reverse sequence (i.e. descending address order) the test ensures that writing into cell "J" does not disturb the contents of cell "I", where "I" and "J" are contiguous cells and "I" is before "J" in memory. By writing the embedded RAM in both a forward and a reverse sequence, cell independence is ensured. And finally, including all cells in the forward and reverse sequence ensures cell uniqueness.

In a typical 5N March test, the sequence executed on each address of the RAM is a read-compare, followed by a write of the complemented data pattern. As described earlier, the Modified 5N March test of the present invention has an additional read-compare after the write of the complemented data pattern. This modification allows the test to monitor the recovery time of the BIT LINES following a write operation, by ensuring that the SENSE AMP senses the appropriate state of the BITLINES within one clock cycle. The BIT LINES are lines internal to the RAM structure which directly access the RAM cells. The SENSE AMP is also internal to the RAM structure and is an amplifier which reads the status of the BITLINES and drives the result out of the RAM device. Previous 5N March tests do not test for write recovery time problems.

The modified 5N March test is a simple yet comprehensive RAM test that may be easily implemented in hardware. It generates the maximum amount of noise with the appropriate SEED and ensures that each RAM cell is independent, unique and that they meet the write recovery time requirement.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 5 comprises FIG. 5A, FIG. 5B, FIG. 5C, FIG. 5D, FIG. 5E, and FIG. 5F, and these respective diagrams when taken together, comprise a detailed flow chart of the test sequence as provided by thee preferred embodiment of the present invention;

DETAILED DESCRIPTION OF THE PREFERRED EMBODIMENT

Figure 1:
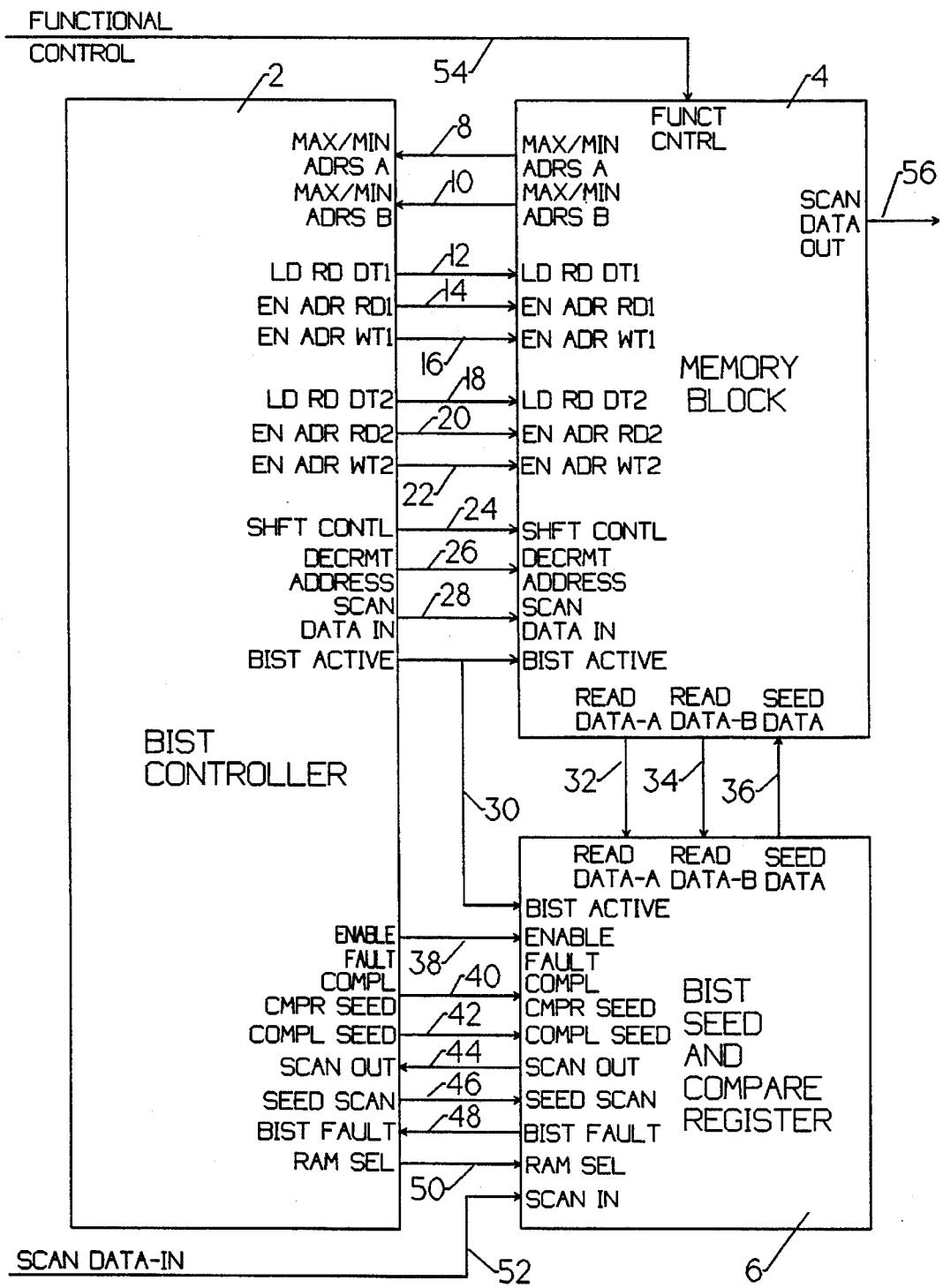
FIG. 1 is a block diagram of the test logic for the preferred embodiment of the present invention.

FIG. 1 is a block diagram of the test logic for the preferred embodiment of the present invention. Bist Controller 2 controls the sequence and timing of all BIST operations. Bist Controller 2 is coupled to BIST Seed and Compare Register 6 via interfaces 30, 38, 40, 42, 44, 46, 48, and 50. These interfaces provide the required control signals between Bist Controller 2 and BIST Seed and Compare Register 6. BIST Seed and Compare Register 6 is further coupled to Memory Block 4 via interfaces 32, 34 and 36. Finally, BIST Seed and Compare Register 6 receives Scan-In-Data via interface 52. The contents of BIST Seed and Compare Register 6 are further discussed in FIG. 2.

Bist Controller 2 is further coupled to Memory Block 4 via interfaces 8, 10, 12, 14, 16, 18, 20, 22, 24, 26, 28, and 30. Interfaces 12, 14, 16, 18, 20, 22, 24, 26, 28 and 30 provide control signals from Bist Controller 2 to Memory Block 4. Interfaces 8 and 10 provide feed back signals from Memory Block 4 to Bist Controller 2. Functional Control Interface 54 is coupled to Memory Block 4 for providing when the system is in functional mode. Memory Block 4 provides as outputs MAX/MIN-ADRS-A 8 MAX/MIN-ADRS-B 10, Scan Data Out 56, Read-Data-A 32 and Read-Data-B 34. The contents and functionality of Memory Block 4 are further discussed in FIG. 3.

Figure 2:
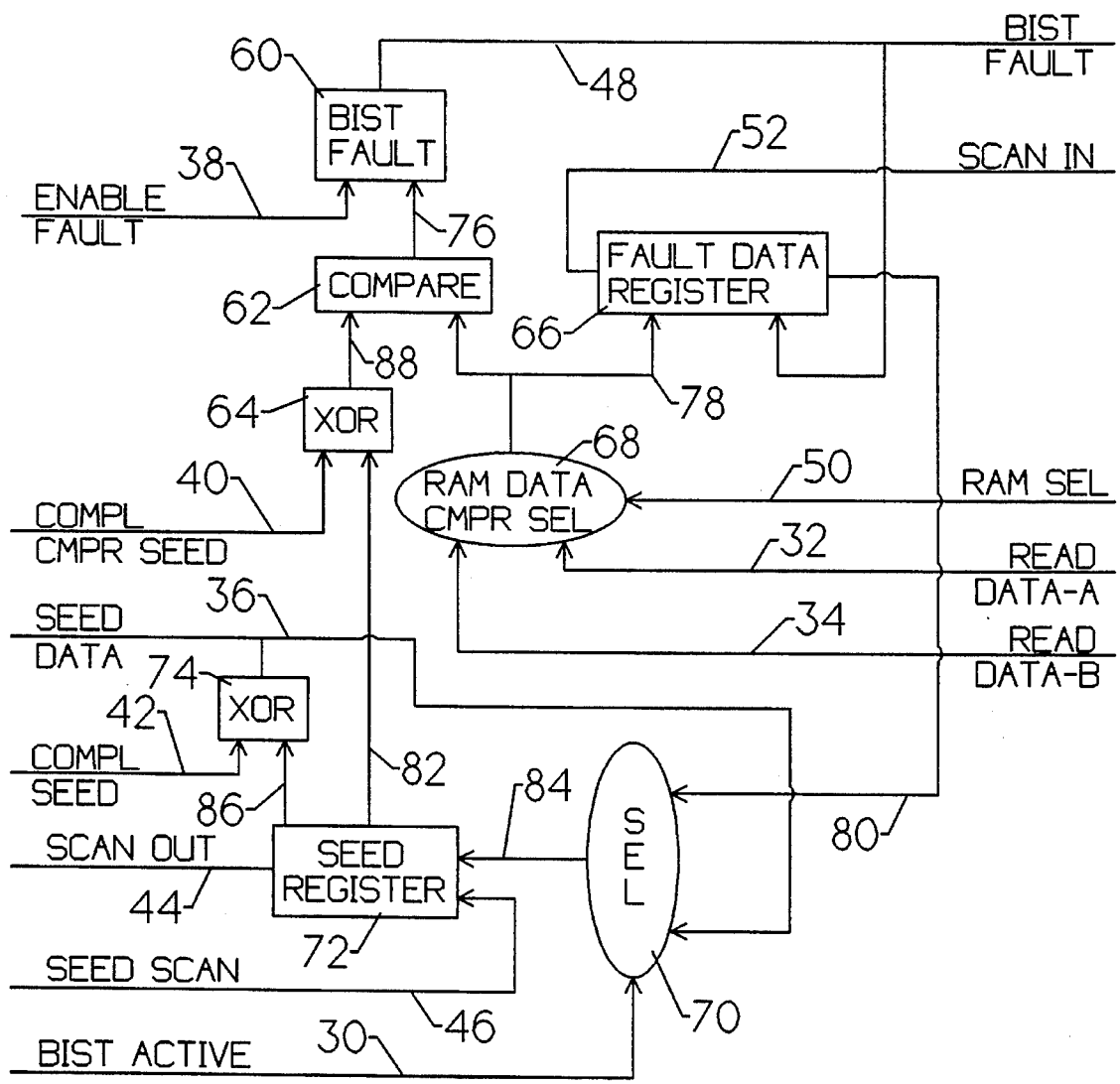
FIG. 2 is a block diagram of the contents of BIST SEED AND COMPARE REGISTER 6 of FIG. 1.

FIG. 2 is a block diagram of the contents of BIST Seed and Compare Register 6 of FIG. 1. In the preferred embodiment, the present invention has the capability of sequentially testing two separate RAM arrays. RAM DATA COMPARE SEL 68 is a 2:1 Multiplexer for selecting between the data from a first RAM array on interface 32 and data from a second RAM array on interface 34. BIST Controller 2 provides a RAM select signal to Ram Data Compare Sel 68 via interface 50. The output of Ram Data Compare Sel 68 is coupled to Compare 62 and Fault Data Register 66 via interface 78.

Seed Register 72 is coupled to Seed Scan Interface 46 and to SEL 70 via interface 84. Seed Register 72 also provides scan out data to BIST Controller 2 via interface 44. In the preferred mode, Seed Register 72 is ten (10) bits wide and is loaded via a static scan string via Seed Scan Interface 46. BIST Controller 2 uses the ten (10) bit Seed Register 72 to build the write data test patterns for each RAM structure. This is accomplished by shifting the 10 bit segment within Seed Register 72 into a write data register (see FIG. 3). The number of 10 bit Seed Register segments required to build the test pattern for each RAM structure is determined by dividing the length of the longest of the two write data registers 122 and 126 (see FIG. 3) by ten (10). Thus a 36 bit wide Write Data Register will require four 10 bit Seed Register segments to build the test pattern with the remainder of 4 bits. BIST Controller 2 then shifts the Write Data Register of the RAM structure thirty-six (36) places to building the RAM test pattern. However, BIST Controller 2 will align the seed register to "home" by continuing to shift Seed Register 72 four more places for a total of forty shifts. Seed Register 72 further provides a parallel output to XOR-gate 74 via interface 86 and XOR-gate 64 via interface 82. XOR-gate 74 is further coupled to BIST Controller 2 via Complement Seed Interface 42. During passes where complemented data is required to be written into the RAM structures, BIST Controller 2 activates Complement Seed interface 42 thus forcing XOR-gate 74 to complement the seed registered data which is on interface 86. During passes where uncomplemented data is required to be written to the RAM structures, BIST Controller 2 deactivates Complement Seed interface 42 thus allowing XOR-gate 74 to directly pass seed register data on interface 86. Either way, the result of XOR-gate 74 is placed on Seed Data interface 36.

SEL 70 is a 2:1 Multiplexer having a first input coupled to Fault Data Register 66 via interface 80, a second input coupled to the output of XOR-gate 74 via interface 36, and a select input coupled to BIST Controller 2 via interface 30. The output of SEL 70 is coupled to Seed Register 72 via interface 84. XOR-gate 64 is coupled to Seed Register 72 via interface 82 and BIST Controller 2 via Complement Compare Seed interface 40. During a pass where complemented data is read from the RAM structures, BIST Controller 2 activates Complement Compare Seed interface 40 forcing XOR-gate 64 to complement the contents of Seed Register 72. During passes where uncomplemented data is read from the RAM structures, BIST Controller 2 deactivates Complement Compare Seed interface 40 thus allowing XOR-gate 64 to directly pass the contents of Seed Register 72. The output of XOR-gate 64 is coupled to Compare 62 via interface 88. Compare 62 compares the actual data read from the RAM structures with an expected pattern. The result of the compare is passed to BIST Fault 60 via interface 76. BIST Fault 60 is a register slice which is enabled by BIST Controller 2 via Enable Fault interface 38. When compare 62 detects a fault, a logic 1 is loaded into BIST Fault 60 on the next clock edge. The contents of BIST Fault 60 are imposed on BIST Fault interface 48. The enable input port of Fault Data Register 66 is also coupled to BIST Fault interface 48. Thus, when BIST Fault 60 is set, Fault Data Register 66 is enabled and the faulty RAM data is stored in Fault Data Register 66. Fault Data Register 66 is also coupled to BIST Controller 2 via scan in interface 52. Note that when a fault occurs, the information stored in Fault Data Register 66 and Seed Register 72 along with other information can be scanned out Scan-Out interface 44 for failure analysis. This information can be used to determine the failing bit or bits within the embedded RAM.

Figure 3:
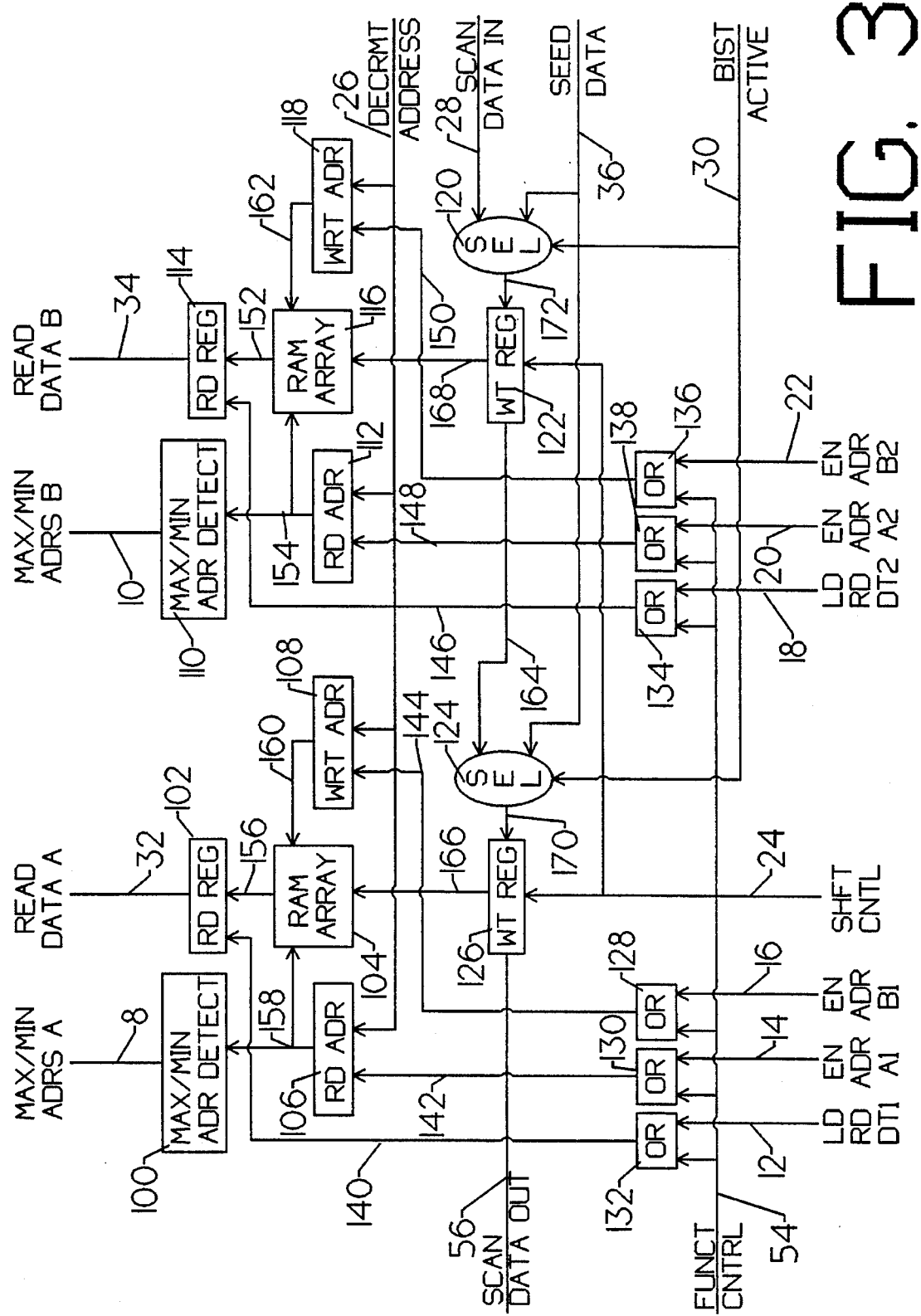
FIG. 3 is a block diagram of the contents of MEMORY BLOCK 4 of FIG. 1.

FIG. 3 is a block diagram of the contents of Memory Block 4 of FIG. 1. The preferred mode of the present invention has RAM Array 104 and RAM array 116 embedded within a VLSI device. The read address for RAM array 104 is provided by RD-ADR 106 via interface 158. The write address of RAM array 104 is provided by WRT-ADR 108 via interface 160. The write data for RAM array 104 is provided by WT-REG 126 via interface 166. The read data for RAM array 104 is captured by RD-REG 102 via interface 156 and is provided to BIST Seed and Compare Register 6 via interface 32. The enable port of RD-ADR 106 is coupled to XOR-gate 130 via interface 142. A first input of XOR-gate 130 is coupled to FUNCT CNTRL 54 and a second input of XOR-gate 130 is coupled to BIST Controller 2 via EN-ADR-A1 interface 14. The enable input port of WRT-ADR 108 is coupled to XOR-gate 128 via interface 144. A first input of XOR-gate 128 is coupled to FUNCT CNTRL 54 and a second input of XOR-gate 128 is coupled to BIST Controller 2 via EN-ADR-B1 interface 16. The enable input port of RD-REG 102 is coupled to XOR-gate 120 via interface 140. A first input of XOR-gate 132 is coupled to FUNCT CNTRL 54 and a second input of XOR-gate 132 is coupled to BIST Controller 2 via LD-RD-DT1 interface 12. WT-REG 126 comprises a shift register which is controlled by BIST Controller 2 via interface SHFT-CNTL 24. The scan data output of WT-REG 126 is coupled to Scan Data Out interface 56. The scan data in port of WT-REG 126 is coupled to the output of SEL 124. SEL 124 is a 2:1 multiplexer which selects between the output of WT-REG 122 and Seed Data interface 36. SEL 124 is controlled by BIST Active interface 30. RD-ADR 106 and WRT-ADR 108 have a means for incrementing and decrementing their respective addresses and each has a control port which is coupled to BIST Controller 2 via DECRMT Address interface 26. During passes when the RAM array is being read or written in a descending address order, BIST Controller 2 activates DECRMT Address interface 26 thus forcing RD-ADR 106 and WRT-ADR 108 to decrement their respective addresses. The address value contained in RD-ADR 106 is provided to MAX/MIN ADR DETECT 100 via interface 158. MAX/MIN ADR DETECT 100 sets a flag on interface MAX/MIN-ADRS-A 8 if the contents of RD-ADR 106 are equal to either the maximum or minimum address of RAM Array 104.

The read address for RAM array 116 is provided by RD-ADR 112 via interface 154. The write address of RAM array 116 is provided by WRT-ADR 118 via interface 162. The write data for RAM array 116 is provided by WT-REG 122 via interface 168. The read data for RAM array 116 is captured by RD-REG 114 via interface 152 and is provided to BIST Seed and Compare Register 6 via interface 34. The enable port of RD-ADR 112 is coupled to XOR-gate 138 via interface 148. A first input of XOR-gate 138 is coupled to FUNCT CNTRL 54 and a second input of XOR-gate 138 is coupled to BIST Controller 2 via EN-ADR-A2 interface 20. The enable input port of WRT-ADR 118 is coupled to XOR-gate 136 via interface 150. A first input of XOR-gate 136 is coupled to FUNCT CNTRL 54 and a second input of XOR-gate 136 is coupled to BIST Controller 2 via EN-ADR-B2 interface 22. The enable input port of RD-REG 114 is coupled to XOR-gate 134 via interface 146. A first input of XOR-gate 134 is coupled to FUNCT CNTRL 54 and a second input of XOR-gate 134 is coupled to BIST Controller 2 via LD-RD-DT2 interface 18. Note that LD-RD-DT1 12, EN-ADR-A1 14, and EN-ADR-B1 16 control the enable signals of the registers associated with RAM array 104. Bist Controller 2 only enables these signals when RAM array 104 is being tested. Similarly, LD-RD-DT2 18, EN-ADR-A2 20, and EN-ADR-B2 22 control the enable signals of the registers associated with RAM array 116. Bist Controller 2 only enables these signals when RAM array 116 is being tested. The preferred mode of the present invention tests each of these RAMs sequentially and therefore only one set of these signals is enabled at a any given time. In addition, if the VLSI is in functional mode, FUNCT CNTRL 54 forces the registers associated with both RAM arrays to be enabled.

WT-REG 122 comprises a shift register which is controlled by BIST Controller 2 via interface SHFT-CNTL 24. The scan data output of WT-REG 122 is coupled to SEL 124 via interface 164. The scan data in port of WT-REG 126 is coupled to the output of SEL 120. SEL 120 is a 2:1 multiplexer which selects between the Scan Data In interface 28 and the Seed Data interface 36. SEL 120 is controlled by BIST Active interface 30. RD-ADR 112 and WRT-ADR 118 have a means for incrementing and decrementing their respective addresses and each has a control port which is coupled to BIST Controller 2 via DECRMT Address interface 26. During passes when the RAM array is being read or written in a descending address order, BIST Controller 2 activates DECRMT Address interface 26 thus forcing RD-ADR 112 and WRT-ADR 118 to decrement their respective addresses. The address value contained in RD-ADR 112 is provided to MAX/MIN ADR DETECT 110 via interface 154. MAX/MIN ADR DETECT 110 sets a flag on interface MAX/MIN-ADRS-A 10 if the contents of RD-ADR 112 are equal to either the maximum or minimum address of RAM Array 116.

Memory Block 4, BIST Seed and Compare Register 6 and BIST Controller 2 comprise the hardware that performs the modified 5N march test sequence on embedded RAM devices as described in detail below. Note that this hardware configuration is fully programmable and other test sequences similar to the modified 5N march test sequence can be easily programmed.

Figure 4:
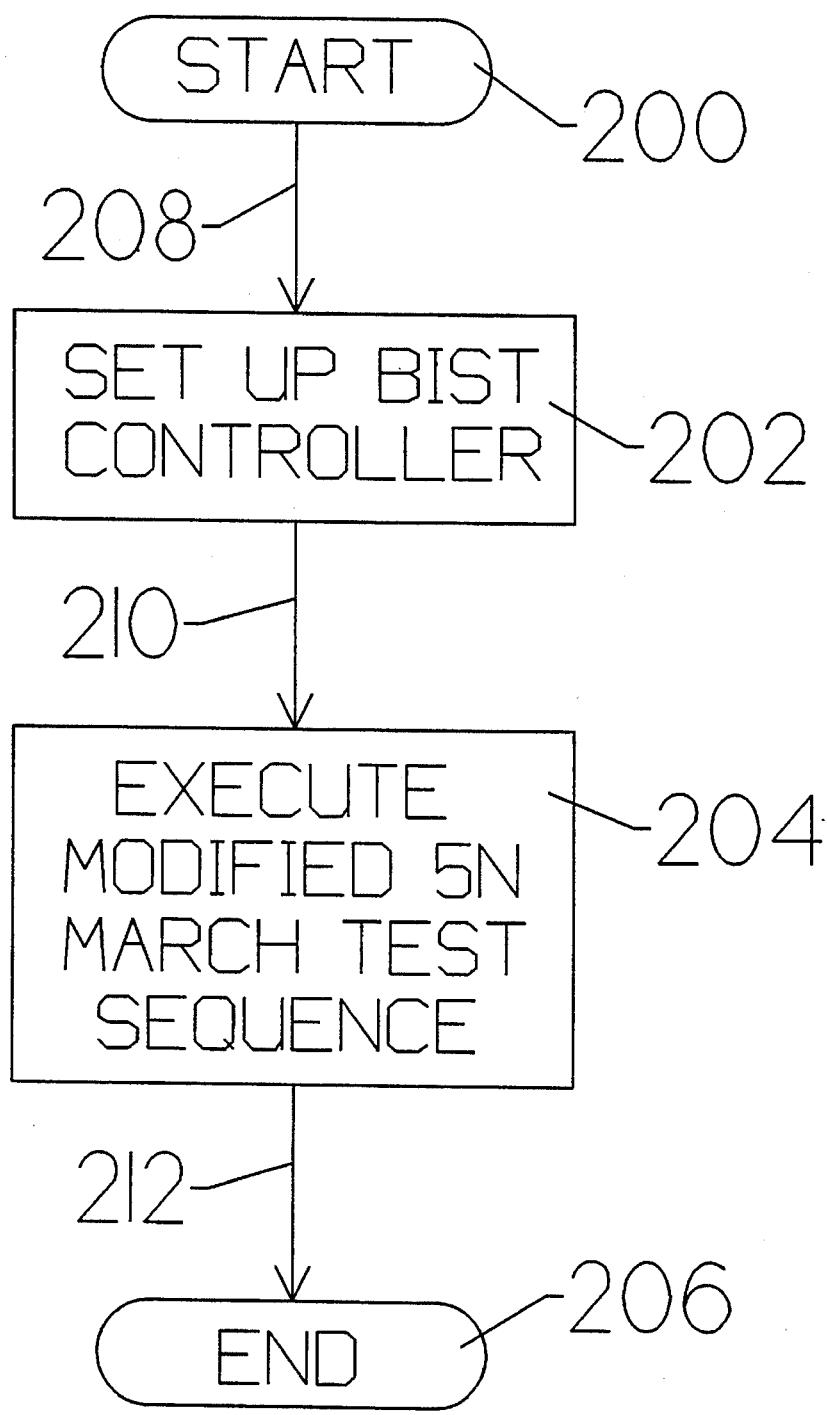
FIG. 4 is a high level flow chart of the test sequence as provided by the preferred embodiment of the present invention.

FIG. 4 is a high level flow chart of the modified 5N march test sequence as provided by the preferred embodiment of the present invention. The test sequence is entered at Start block 200. The BIST control hardware is initialized with a predetermined set of values as indicated by block 202. Next, the modified 5N march test sequence is executed at block 204. The sequence is exited after the test sequence in completed as indicated by END block 206.

FIG. 5 comprises FIG. 5A, FIG. 5B, FIG. 5C, FIG. 5D, FIG. 5E and FIG. 5F. These respective diagrams, when viewed together, comprise a detailed flow chart of the test sequence as provided by the preferred embodiment of the present invention.

Figure 5A:
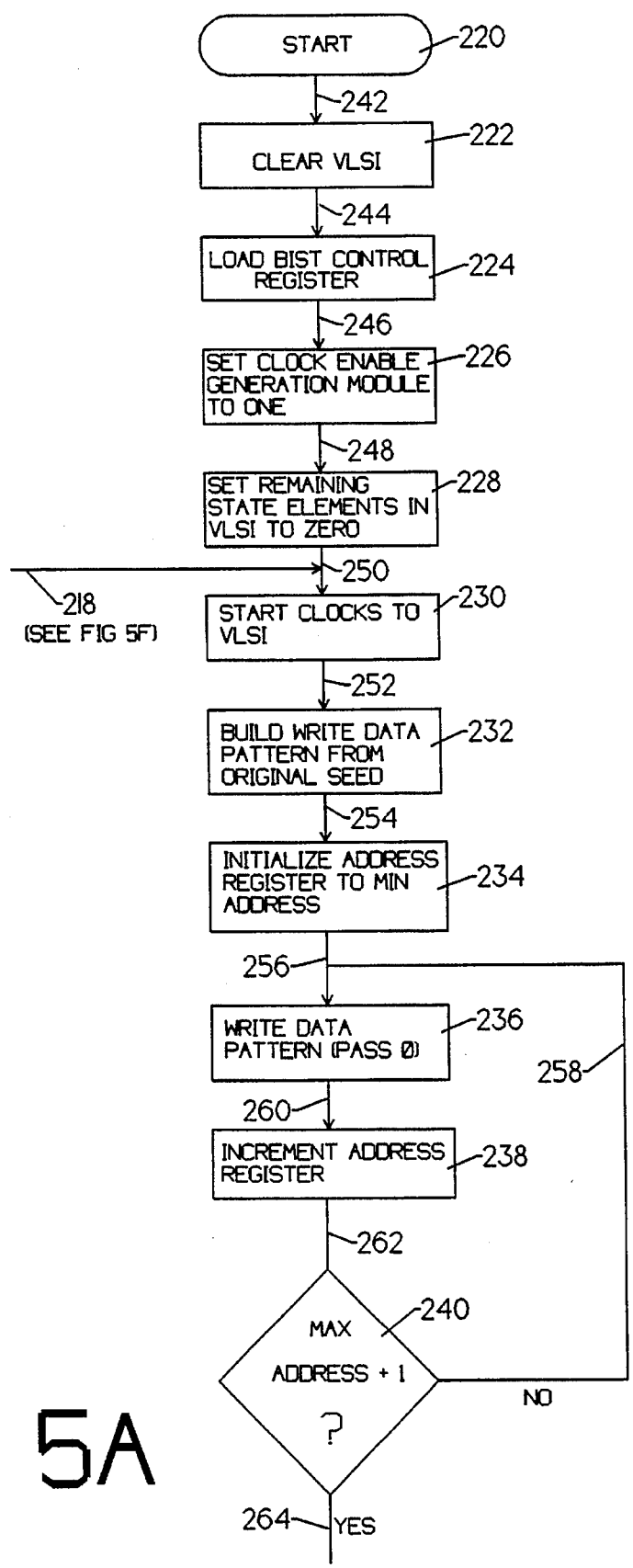
FIG. 5A is the first of six (6) flow charts which, when taken together, cumulatively comprise a detailed flow chart of the test sequence as provided by the preferred embodiment of the present invention.

FIG. 5A is the first of six (6) flow charts which, when viewed together, cumulatively comprise a detailed flow chart of the test sequence as provided by the preferred embodiment of the present invention. The sequence is entered at Start Block 200. Start Block 200 is coupled to Clear VLSI 222 via interface 242. Clear VLSI 222 provides that the VLSI is cleared with the highest level clear terminal within the design. Clear VLSI 222 is coupled to Load BIST Control Register 224 via interface 244. Load BIST Control Register 244 provides that BIST Controller 2 and Seed Register 72 are loaded with initial values. These initial values insure that the modified 5N march test sequence is executed in the proper mode. Load BIST Control Register 224 is coupled to Set Clock Enable Generation Module-to-one 226 via interface 246. Block 226 provides that, in addition to setting up the BIST controller, the clock enable generation modules within the preferred embodiment, must be primed so that when the clock is started, clock enables will be generated. The remaining state elements in the VLSI may be set to zero as indicated by block 228. Next, the clocks to the VLSI are started as indicated by block 230. Block 232 indicates that the write data pattern is built from the original seed contained in Seed Register 72 (see FIG. 2). This is accomplished by shifting data through seed data interface 36 and into WT-REG 126 and WT-REG 122 (see FIG. 3). The next step, as indicated by block 234, is to initialize Address Registers 10, 108, 112, and 118 to the minimum address. After this is completed, the contents of WT-REG 126 and WT-REG 122 are written into RAM array 104 and 116 respectively. This is the Pass-0 write as indicated by Block 236. Address Registers 106, 108, 112, and 118 are then incremented. Next, it is determined whether the incremented address is equal to the maximum address plus one (1) of the embedded RAM as indicated by Block 240. This function is accomplished by MAX/MIN ADR DETECT 100 and MAX/MIN ADR DETECT 110. If the incremented address generated in Block 238 is not equal to the maximum address plus one, then the new address is written with the data pattern as indicated by interface 258 and block 236. This loop is continued until the entire RAM space has been written with the Pass-0 data pattern. Once this is completed the algorithms will drop to block 266 via interface 264.

Figure 5B:
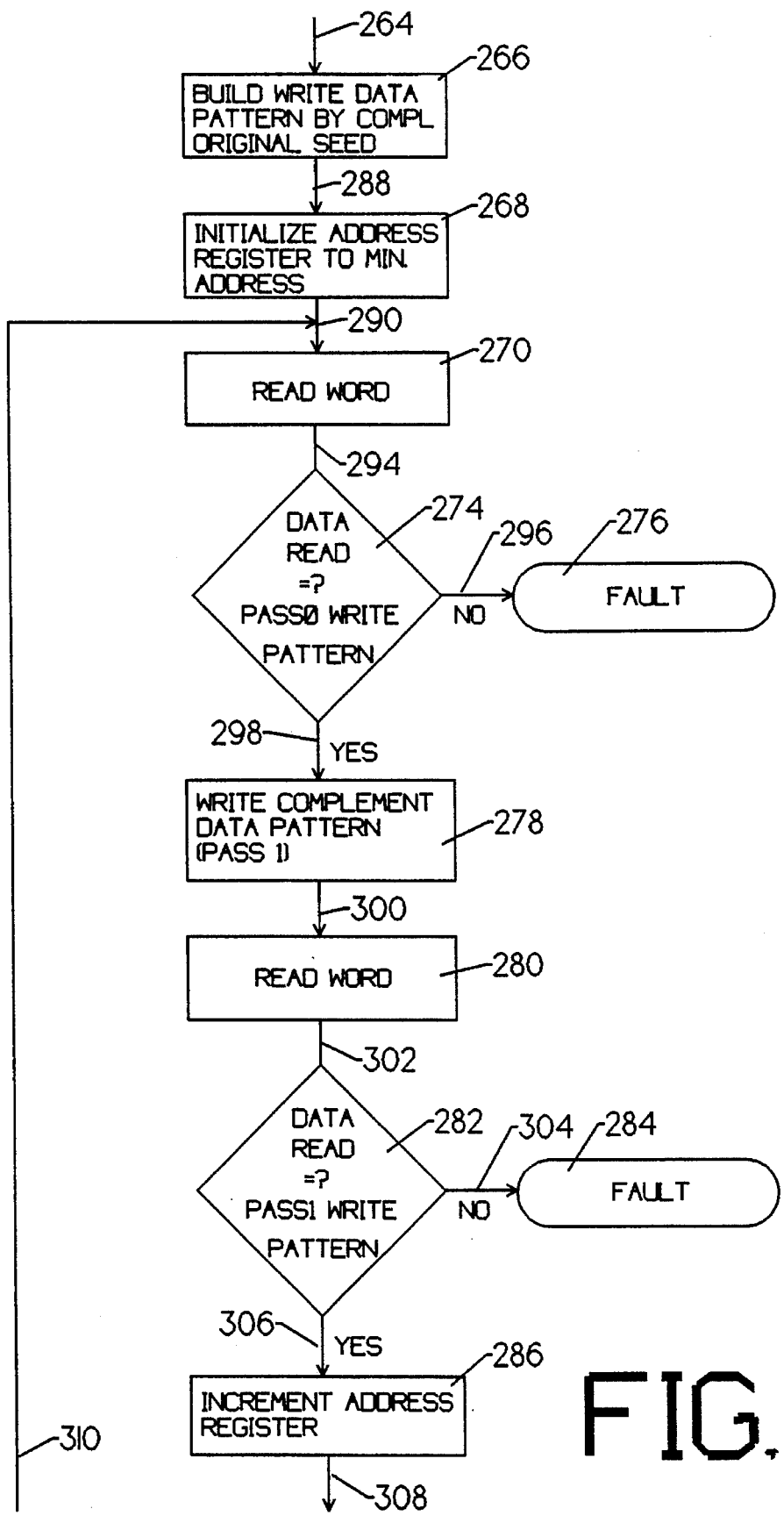
FIG. 5B is the second of six (6) flow charts which, when taken together, cumulatively comprise a detailed flow chart of the test sequence as provided by the preferred embodiment of the present invention.

FIG. 5B is the second of six (6) flow charts which, when viewed together, cumulatively comprise a detailed flow chart of the test sequence as provided by the preferred embodiment of the present invention. As block 266 indicates, the next step is to build a new write data pattern by complementing the original seed. This is accomplished with XOR-gate 74 (see FIG. 2). Again, Address Registers 106, 108, 112, and 118 are set the to minimum address as indicated by block 268. The first word is read and compared to the data that was written during Pass-0 as indicated by blocks 270 and 274. The compare is performed via Compare 62 (see FIG. 2). If the data read does not compare to the previously written value the algorithm produces a fault as indicated by block 276 and the test is terminated. Fault 276 is implemented with BIST Fault Register 60 (see FIG. 2). If the data read does compare to the data written in Pass-0, then the complemented data pattern is written to that address as indicated by block 278. The data pattern is complemented via XOR-gate 274 (see FIG. 2). During the next clock cycle, the complemented data pattern that was just written, is read back and compared to the complemented Pass-1 write pattern as indicated by blocks 280 and 282. This last read operation tests the recovery time of the bit lines within the RAM structures by ensuring that the sense amplifier within the embedded RAM can sense the appropriate state of the bit lines within one clock cycle. If the bit lines have a write recovery problem, incorrect data will be read during the last read operation. The bit lines are the line which couple directly to the memory cells within the RAM structure. When the appropriate cell is selected, the bit lines are charged by the RAM cell to the same logic level as the RAM cell. The sense amplifier reads the status of the bit lines and drives this value out of the embedded RAM structure. If the data read from the RAM is not equal to the Pass-1 write pattern then a fault is issued via block 284. If the data read equals the Pass-1 write pattern then the address is incremented as indicated by block 286. The algorithm then determines whether the incremented address is equal to the maximum address plus one as indicated by block 320. As stated above, this is accomplished via MAX/MIN ADR DETECT 100 and MAX/MIN ADR DETECT 110. If the maximum address has not been reached, the algorithm reverts back to block 270 via interface 310 and reads the next word within the RAM structure. This loop is continued until the maximum address is reached. Once the maximum address is reached, control is given to block 322 which indicates the beginning of Pass-2.

Figure 5C:
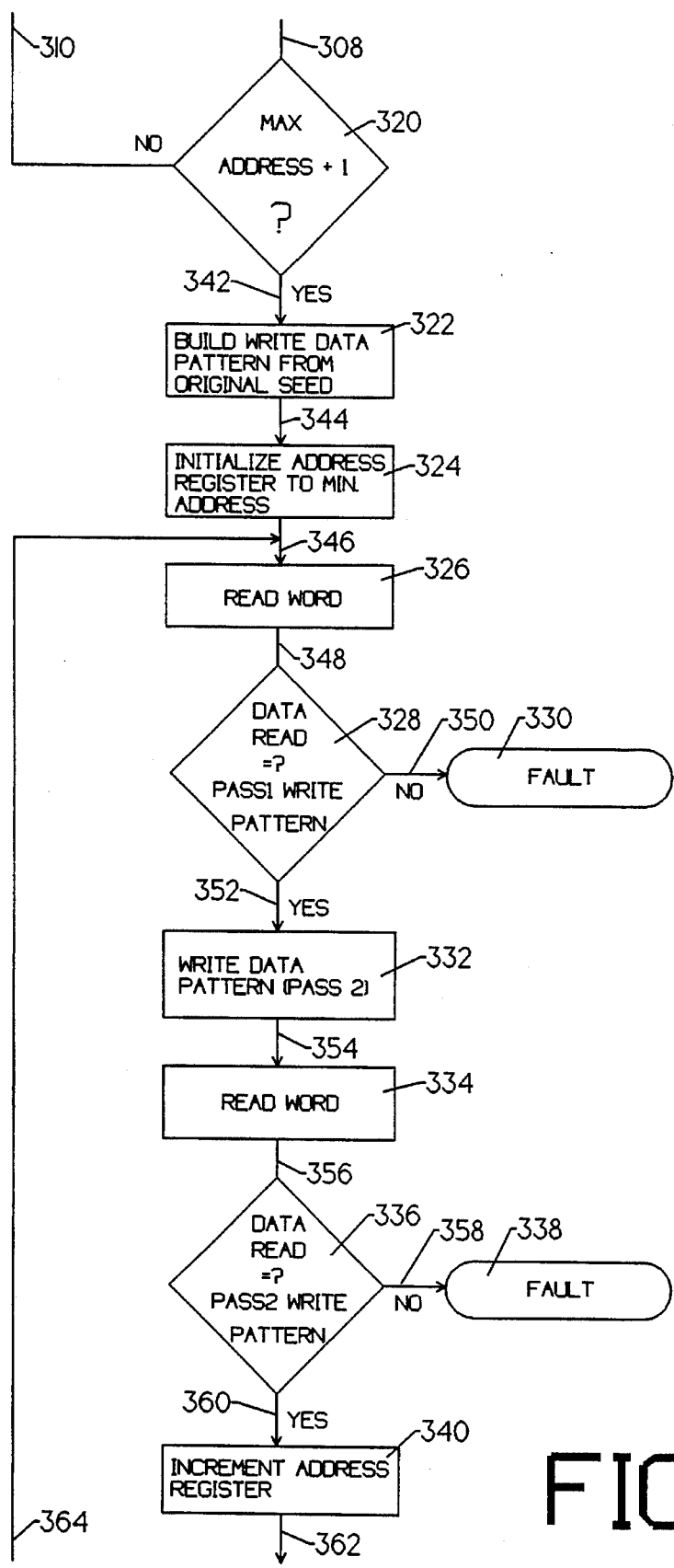
FIG. 5C is the third of six (6) flow charts which, when taken together, cumulatively comprise a detailed flow chart of the test sequence as provided by the preferred embodiment of the present invention.

FIG. 5C is the third of six (6) flow charts which, when viewed together, cumulatively comprise a detailed flow chart of the test sequence as provided by the preferred embodiment of the present invention. As block 322 indicates, the next step is to build a new write data pattern from the original seed. Again, Address Registers 106, 108, 112, and 118 are set the to minimum address as indicated by block 324. The first word is read and compared to the data that was written during Pass-1 as indicated by blocks 326 and 328. The compare is performed via Compare 62 (see FIG. 2). If the data read does not compare to the previously written value the algorithm produces a fault as indicated by block 330 and the test is terminated. Fault 330 is implemented with BIST Fault Register 60 (see FIG. 2). If the data read does compare to the data written in Pass-1, then the data pattern is written to that address as indicated by blocks 328 and 332. During the next clock cycle, the data pattern that was just written is read back and compared to the expected value as indicated by blocks 334 and 336. This last read operation tests the recovery time of the bit lines within the RAM structures by ensuring that the sense amplifier within the embedded RAM can sense the appropriate state of the bit lines within one clock cycle. If the sense bit lines have a write recovery problem, incorrect data will be read during the last read operation. If the data read from the RAM is not equal to the Pass-2 write pattern then a fault is issued via block 338. If the data read equals the Pass-2 write pattern then the address is incremented as indicated by block 340.

Figure 5D:
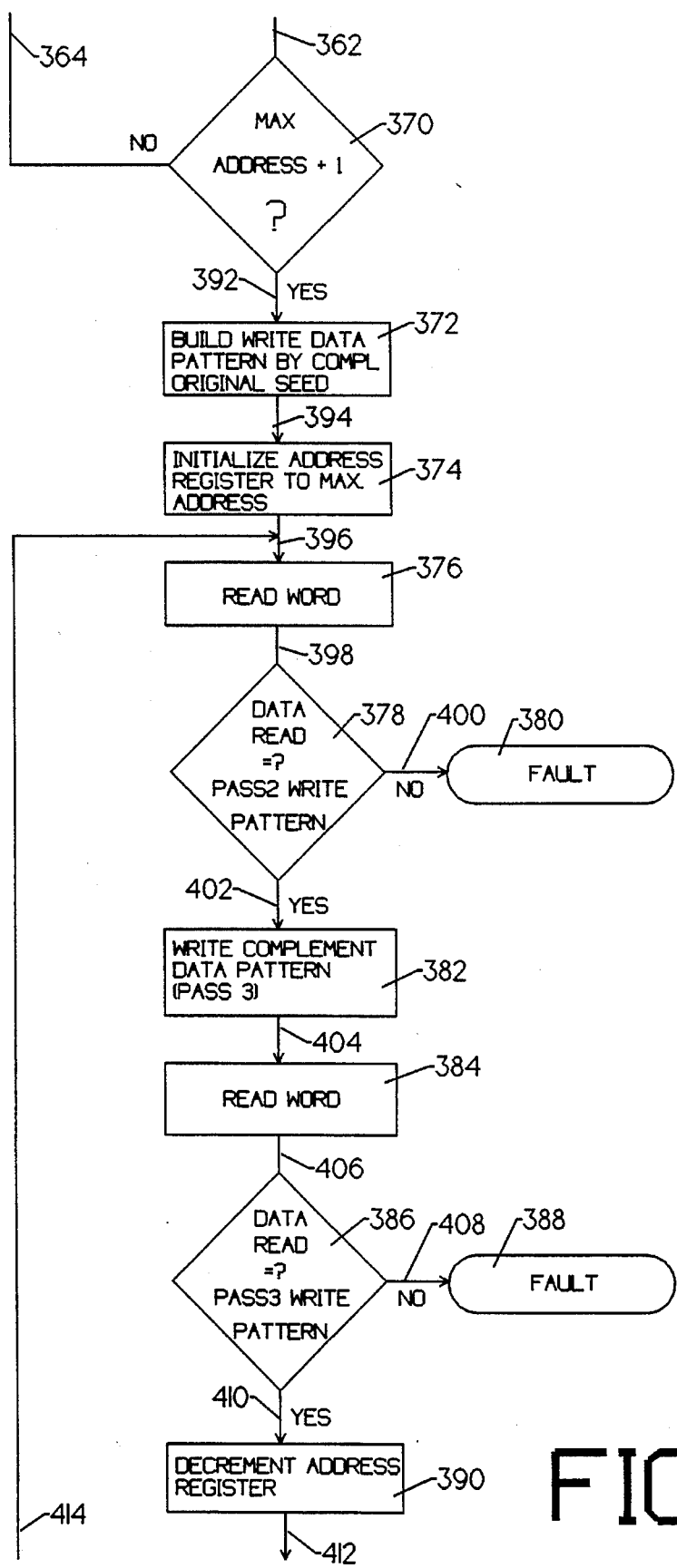
FIG. 5D is the fourth of six (6) flow charts which, when taken together, cumulatively comprise a detailed flow chart of the test sequence as provided by the preferred embodiment of the present invention.

FIG. 5D is the fourth of six (6) flow charts which, when viewed together, cumulatively comprise a detailed flow chart of the test sequence as provided by the preferred embodiment of the present invention. The algorithm determines whether the incremented address is equal to the maximum address plus one as indicated by block 370. As stated above, this is accomplished via MAX/MIN ADR DETECT 100 and MAX/MIN ADR DETECT 110. If the maximum address has not been reached, the algorithm reverts back to block 326 via interface 364 and reads the next word within the embedded RAM structure. This loop is continued until the maximum address is reached. Once the maximum address is reached, control is given to block 372 which indicates the beginning of Pass-3.

As block 372 indicates, the next step is to build a new write data pattern by complementing the original seed. For Pass-3, Address Registers 106, 108, 112, and 118 are set the to maximum address value as indicated by block 374. The last word is read and compared to the data that was written during Pass-2 as indicated by blocks 376 and 378. The compare is performed via Compare 62 (see FIG. 2). If the data read does not compare to the previously written value the algorithm produces a fault as indicated by block 380 and the test is terminated. Fault 380 is implemented with BIST Fault Register 60 (see FIG. 2). If the data read does compare to the data written in Pass-2, the new data pattern is written to that address as indicated by block 382. During the next clock cycle, the address that was just written is read back and compared to the new data pattern as indicated by blocks 384 and 386. This last read operation tests the recovery time of the bit lines within the RAM structures by ensuring that the sense amplifier within the embedded RAM can sense the appropriate state of the bit lines within one clock cycle. If the sense bit lines have a write recovery problem, incorrect data will be read during the last read operation. If the data read from the RAM is not equal to the Pass-3 write pattern then a fault is issued via block 388. If the data read equals the Pass-3 write pattern then the address is decremented as indicated by block 390.

Figure 5E:
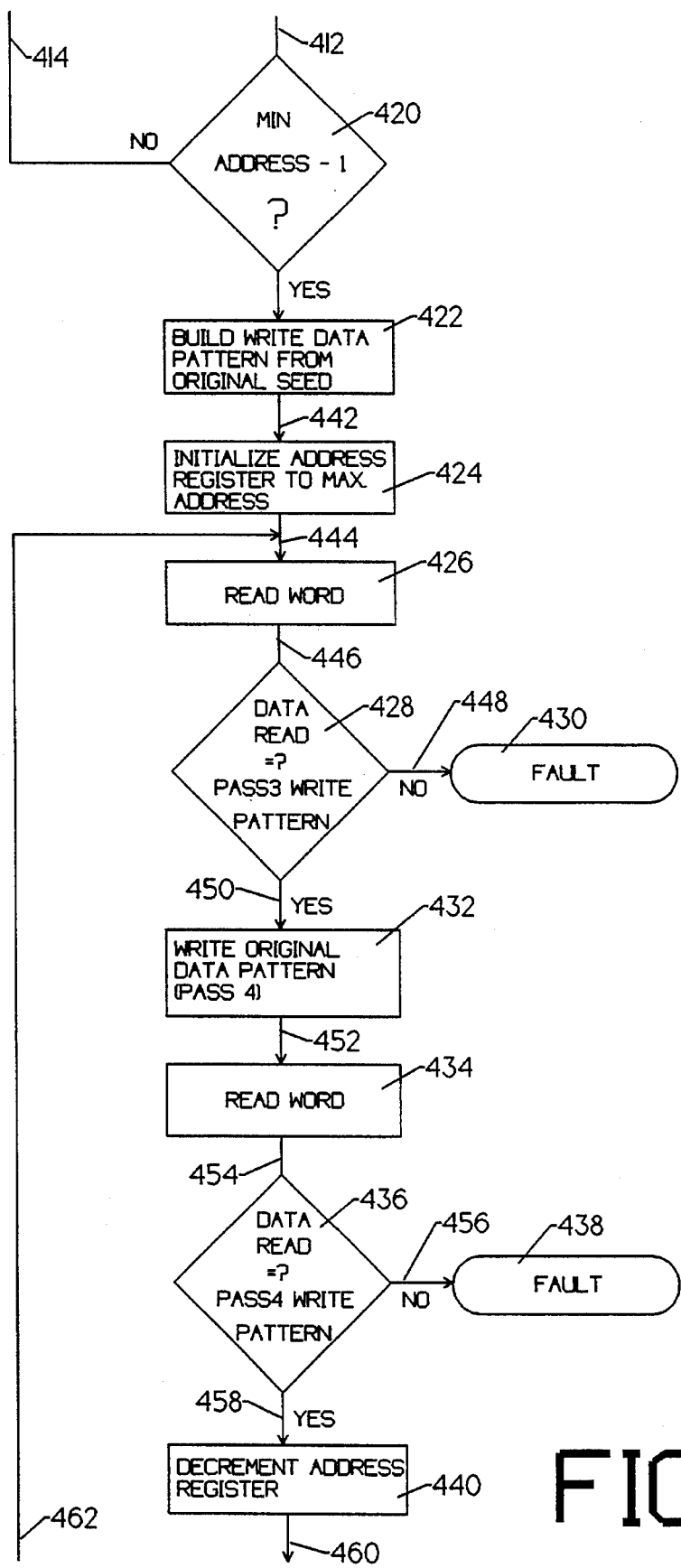
FIG. 5E is the fifth of six (6) flow charts which, when taken together, cumulatively comprise a detailed flow chart of the test sequence as provided by the preferred embodiment of the present invention.

FIG. 5E is the fifth of six (6) flow charts which, when viewed together, cumulatively comprise a detailed flow chart of the test sequence as provided by the preferred embodiment of the present invention. Continuing from FIG. 5D, the algorithm then determined whether the decremented address is equal to the minimum address minus one as indicated by block 420. As stated above, this is accomplished via MAX/MIN ADR DETECT 100 and MAX/MIN ADR DETECT 110. If the minimum address has not been reached, the algorithm reverts back to block 376 via interface 414 and reads the next word within the embedded RAM structure. This loop is continued until the minimum address is reached. Once the minimum address is reached, control is given to block 422 which indicates the beginning of Pass-4.

As block 422 indicates, the next step is to build a new write data pattern from the original seed. For Pass-4, Address Registers 106, 108, 112, and 118 are again set the to maximum address value as indicated by block 424. The last word is read and compared to the data that was written during Pass-3 as indicated by blocks 426 and 428. The compare is performed via Compare 62 (see FIG. 2). If the data read does not compare to the previously written value the algorithm produces a fault as indicated by block 430 and the test is terminated. Fault 430 is implemented with BIST Fault Register 60 (see FIG. 2). If the data read does compare to the data written in Pass-3, the new data pattern is written to that address as indicated by block 432. During the next clock cycle, the address that was just written is read back and compared to the new data pattern as indicated by blocks 434 and 436. This last read operation tests the recovery time of the bit lines within the RAM structures by ensuring that the sense amplifier within the embedded RAM can sense the appropriate state of the bit lines within one clock cycle. If the sense bit lines have a write recovery problem, incorrect data will be read during the last read operation. If the data read from the RAM is not equal to the Pass-4 write pattern then a fault is issued via block 438. If the data read equals the Pass-4 write pattern then the address is decremented as indicated by block 440.

Figure 5F:
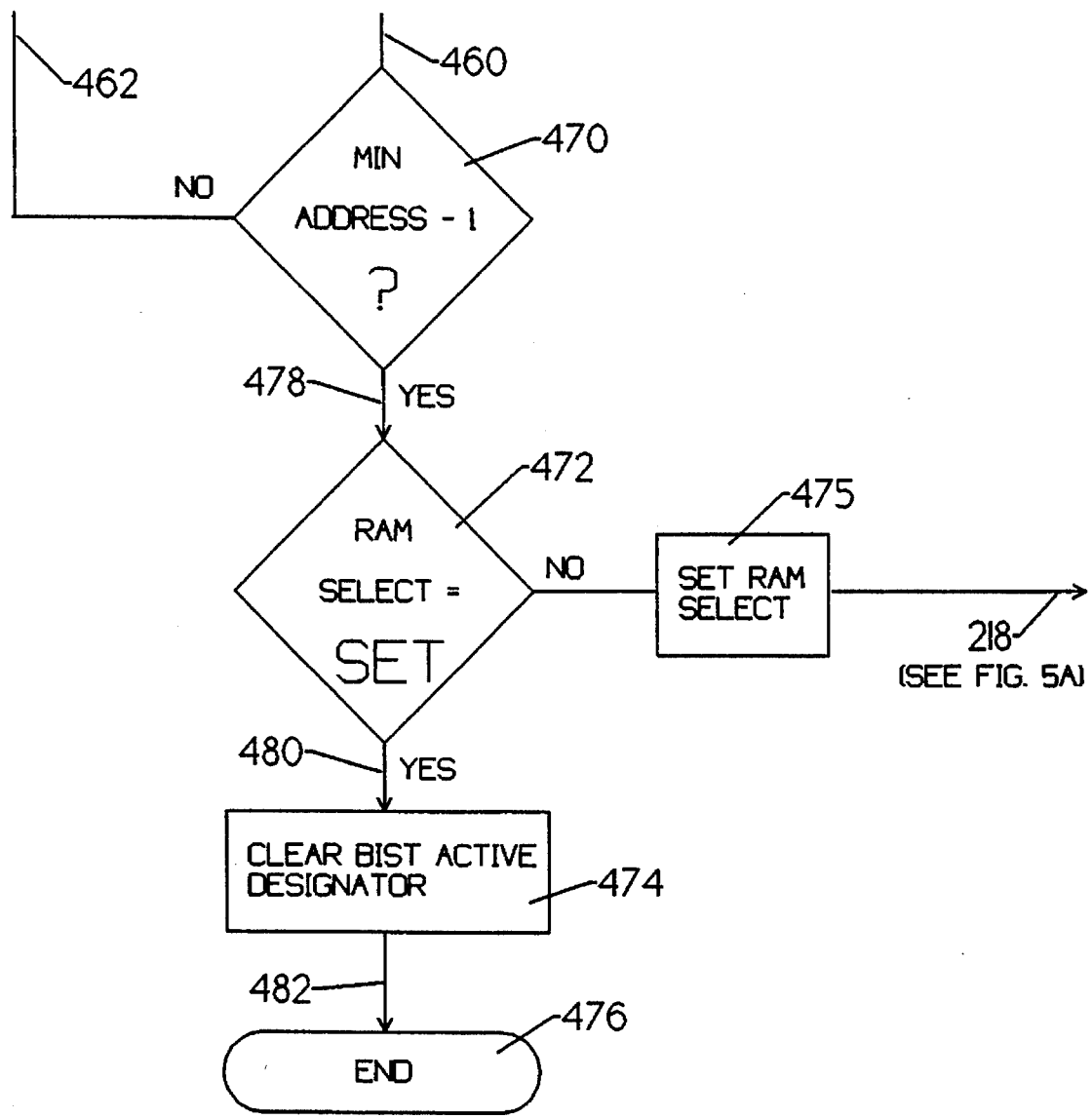
FIG. 5F is the sixth of six (6) flow charts which, when taken together, cumulatively comprise a detailed flow chart of the test sequence as provided by the preferred embodiment of the present invention.

FIG. 5F is the sixth of six (6) flow charts which, when viewed together, cumulatively comprise a detailed flow chart of the test sequence as provided by the preferred embodiment of the present invention. Continuing from FIG. 5E, the algorithm then determined whether the decremented address is equal to the minimum address minus one as indicated by block 470. As stated above, this is accomplished via MAX/MIN ADR DETECT 100 and MAX/MIN ADR DETECT 110. If the minimum address has not been reached, the algorithm reverts back to block 426 via interface 462 and reads the next word within the embedded RAM structure. This loop is continued until the minimum address is reached. Once the minimum address is reached, control is given to block 472 which determines if all RAM structures have been tested.

As stated earlier, the preferred mode of the present invention sequentially tests all embedded RAM structure within a VLSI device. Therefore, the present invention has a mechanism for determining when all of the embedded RAM structures have been tested. Block 472 compares a RAM select signal to a predetermined value. If it is determined that all of the RAM's have not been tested, control is given to block 475. Block 475 sets the appropriate signals within the system to enable the next embedded RAM structure to be tested and returns control to block 230 via interface 218. The entire process is started again. If all embedded RAM structures have been tested, control passes to block 474. Block 474 clears the BIST active designator and terminates the test as indicated by END block 476.

Having thus described the preferred embodiments of the present invention, those of skill in the art will readily appreciate that yet other embodiments may be made and used within the scope of the claims hereto attached.

We claim:

1. A method for performing a test of a RAM structure having a plurality of RAM cells, comprising the steps of:

a. writing a first data pattern built from a seed to each RAM cell consecutively between the minimum cell address and the maximum cell address;

b. reading back the data pattern from the minimum cell address of the RAM structure and comparing the result to the data written to that address in step (a) and indicating a fault if the data read does not match the data written;

c. writing a second data pattern built from a compliment of the seed to the minimum cell address of the RAM structure;

d. reading back the data pattern from the minimum cell address of the RAM structure and comparing the result to the data written to that address in step (c) and indicating a fault if the data read does not match the data written;

e. rewriting the second data pattern built from the compliment of the seed to the minimum cell address of the RAM structure;

f. repeating steps (b)–(e) for each address in the RAM structure from the minimum cell address to the maximum cell address;

g. reading back the data pattern from the minimum cell address of the RAM structure and comparing the result to the data written to that address in step (f) and indicating a fault if the data read does not match the data written;

h. writing a data pattern built from the original seed to the minimum cell address of the RAM structure;

i. reading back the data pattern from the minimum cell address of the RAM structure and comparing the result to the data written to that address in step (h) and indicating a fault if the data read does not match the data written;

j. rewriting the data pattern built from the original seed to the minimum Cell address of the RAM structure;

k. repeating steps (g)–(j) for each address in the RAM structure from the minimum cell address to the maximum cell address;

l. reading back the data pattern from the maximum cell address of the RAM structure and comparing the result to the data written to that address in step (k) and indicating a fault if the data read does not match the data written;

m. writing a second data pattern built from a compliment of the seed to the maximum cell address of the RAM structure;

n. reading back the data pattern from the maximum cell address of the RAM structure and comparing the result to the data written to that address in step m, and indicating a fault if the data read does not match the data written;

o. rewriting the second data pattern built from the compliment of the seed to the maximum cell address of the RAM structure;

p. repeating steps (l)–(o) for each address in the RAM structure from the maximum cell address to the minimum cell address;

q. reading back the data pattern from the maximum cell address of the RAM structure and comparing the result to the data written to that address in step p, and indicating a fault if the data read does not match the data written;

r. writing a data pattern built from the original seed to the maximum cell address of the RAM structure;

s. reading back the data pattern from the maximum cell address of the RAM structure and comparing the result to the data written to that address in step r, and indicating a fault if the data read does not match the data written; and t. rewriting the data pattern built from the original seed to the maximum cell address of the RAM structure;

u. repeating steps (q)–(t) for each address in the RAM structure from the maximum cell address to the minimum cell address.

2. A method for performing a built-in self-test of one or more embedded RAMs, each having a plurality of RAM cells, comprising the steps of:

a. selecting a first embedded RAM for testing;

b. writing a first data pattern built from a seed to each RAM cell in the selected embedded RAM consecutively between the minimum cell address and the maximum cell address;

c. reading back the data pattern from the minimum cell address of the selected embedded RAM and comparing the result to the data written to that address in step (b) and indicating a fault if the data read does not match the data written;

d. writing a second data pattern built from a compliment of the seed to the minimum cell address of the selected embedded RAM;

e. reading back the data pattern from the minimum cell address of the selected embedded RAM and comparing the result to the data written to that address in step (d) and indicating a fault if the data read does not match the data written;

f. rewriting the second data pattern built from the compliment of the seed to the minimum cell address of the selected embedded RAM;

g. repeating steps (c)–(f) for each address in the selected embedded RAM from the minimum cell address to the maximum cell address;

h. reading back the data pattern from the minimum cell address of the selected embedded RAM and comparing the result to the data written to that address in step (g) and indicating a fault if the data read does not match the data written;

i. writing a data pattern built from the original seed to the minimum cell address of the selected embedded RAM;

j. reading back the data pattern from the minimum cell address of the selected embedded RAM and comparing the result to the data written to that address in step (i) and indicating a fault if the data read does not match the data written;

k. writing the data pattern built from the original seed to the minimum cell address of the selected embedded RAM;

l. repeating steps (h)–(k) for each address in the selected embedded RAM from the minimum cell address to the maximum cell address;

m. reading back the data pattern from the maximum cell address of the selected embedded RAM and comparing the result to the data written to that address in step (l) and indicating a fault if the data read does not match the data written;

n. writing a second data pattern built from a compliment of the seed to the maximum cell address of the selected embedded RAM;

o. reading back the data pattern from the maximum cell address of the selected embedded RAM and comparing the result to the data written to that address in step (n) and indicating a fault if the data read does not match the data written;

p. writing the second data pattern built from the compliment of the seed to the maximum cell address of the selected embedded RAM;

q. repeating steps (m)–(p) for each address in the selected embedded RAM from the maximum cell address to the minimum cell address;

r. reading back the data pattern from the maximum cell address of the selected embedded RAM and comparing the result to the data written to that address in step (q) and indicating a fault if the data read does not match the data written;

s. writing a data pattern built from the original seed to the maximum cell address of the selected embedded RAM;

t. reading back the data pattern from the maximum cell address of the selected embedded RAM and comparing the
result to the data written to that address in step s, and indicating a fault if the data read does not match the data written;

u. rewriting the data pattern built from the original seed to the maximum cell address of the Selected embedded RAM;

v. repeating steps (r)–(u) for each address in the selected embedded RAM from the maximum cell address to the minimum cell address; and w. repeating steps (a)–(v) for each one of the one or more embedded RAMs.

* * * * *